United States Patent [19]

Hunter, Jr. et al.

[11] Patent Number: 5,364,493
[45] Date of Patent: Nov. 15, 1994

[54] APPARATUS AND PROCESS FOR THE PRODUCTION OF FINE LINE METAL TRACES

[75] Inventors: Robert O. Hunter, Jr., Rancho Santa Fe; Adlai H. Smith; Bruce B. McArthur, both of San Diego, all of Calif.

[73] Assignee: Litel Instruments, San Diego, Calif.

[21] Appl. No.: 58,906

[22] Filed: May 6, 1993

[51] Int. Cl.⁵ .......................... B44C 1/22; C23F 1/00; B29C 37/00
[52] U.S. Cl. .................................... 156/630; 156/634; 156/652; 156/656; 156/668; 156/345; 156/902; 156/643; 219/121.69
[58] Field of Search ............... 156/630, 634, 645, 651, 156/652, 656, 659.1, 668, 901, 902, 345, 643; 29/846; 219/121.68, 121.69, 121.85; 430/5

[56] References Cited

U.S. PATENT DOCUMENTS

| | | | |
|---|---|---|---|
| 4,780,177 | 10/1988 | Wojnarowski et al. | 156/643 |
| 4,786,358 | 11/1988 | Yamazaki et al. | 156/643 |
| 4,842,677 | 6/1989 | Wojnarowski et al. | 156/643 |
| 4,915,981 | 4/1990 | Traskos et al. | 156/643 X |
| 4,940,508 | 7/1990 | Shamouilian et al. | 156/643 |

*Primary Examiner*—William Powell
*Attorney, Agent, or Firm*—Townsend and Townsend, Khourie and Crew

[57] ABSTRACT

A metallic substrate such a copper foil has an etch barrier such polyimide, Saran Wrap ®, or other plastic applied. This barrier is thereafter selectively etched or ablated with a laser, for example by passing the light through a phase reticle or phase mask having at least the image information for the fine metallic lines thereon. The remaining barrier then acts in a second etch process to remove the underlying metallic layer. A wet or dry (such as RIE) etch may be employed. Over conventional photoresist exposure methods, the developer and resist steps are eliminated. The laser can precisely pattern the barrier in a single step with the remainder of the production of the required metallic fine lines relying on a simple wet etch, a process whose control parameters are well understood and consume little time. Alternately, a process for the direct ablation of metallic layers is disclosed.

23 Claims, 6 Drawing Sheets

APPARATUS AND PROCESS FOR THE PRODUCTION OF FINE LINE METAL TRACES

This invention relates to a subtractive etch process utilizing light for producing fine line metallic traces. More particularly, a process and apparatus is disclosed in which high intensity light is incident through a pattern containing the metal traces desired to be ablated and then ablates a protective coating to enable a subtractive etch to produce the traces. In the preferred embodiment, diffraction gratings formed in the outline of the desired metallic traces, deflect light from ablation of a protective layer to enable the subtractive etch.

BACKGROUND OF THE INVENTION

Fine line metallic traces have heretofore usually been made utilizing a photoresist. Simply summarized, a working substrate is coated with photoresist. Thereafter, a mask having the desired fine line metallic traces is imaged onto the photoresist. The photoresist is thereafter "developed", usually in processes that require many steps, time, and careful process control. Thereafter, there remains a working substrate having the fine line pattern outlined in the developed photoresist. This pattern can be thereafter additively plated up or subtractively etched to produce the final and desired metallic fine line traces.

Unfortunately, methods of producing fine line traces utilizing the development of photoresist are complicated in the sensitivity of the photoresist, the process control required in the development process, and the time required from placement of the photoresist to the production of the substrate having the desired fine lines.

When ordinary masks are utilized, controlling of zones of high contrast in the photoresist is a problem. Photoresist in effect integrates the light incident upon it. Where a high exposure contrast is needed to delineate a boundary between a metal line in the remainder of the work substrate, light spill or diffraction can spoil the required linear by gradual light exposure of the photoresist.

Further, photoresist requires development. This is a multi-step time consuming process requiring chemistry, temperature, and light control procedures. Development adds considerable complication to the production of the required metal lines. Failure to adhere strictly to the required control limits directly impacts yield.

Finally, where development is required, time is consumed. Periods of up to one day can be consumed in the exposure and development of a single layer containing fine metal lines.

SUMMARY OF THE INVENTION

A metallic substrate such a copper foil has an etch barrier such polyimide, Saran Wrap®, mylar, or other plastic applied. This barrier is thereafter selectively etched or ablated with a laser, for example by passing the light through a phase mask having at least the image information for the fine metallic lines thereon. The remaining barrier then acts as an etch block for the wet etch process that removes the underlying metallic layer. Over conventional photoresist exposure methods, the developer and resist steps are eliminated. The laser can precisely pattern the barrier in a single step with the remainder of the production of the required metallic fine lines relying on a simple wet etch, a process whose control parameters are well understood and consume little time. Alternately, a process for the direct ablation of metallic layers is disclosed which can produce a circuit on a substrate in a single step. Alternately, this circuit can be itself plated.

In a preferred embodiment, a quartz plate is etched with diffraction gratings in the precise pattern of the lines that are desired to be produced. The produced quartz plate and pattern is then positioned between a scanning laser light source and barrier coated metallic substrate. In a preferred embodiment, a scanning laser light source incident on the plate and an imaging objective system (preferably having applicable stops), simultaneously scan the plate with the resultant passed light ablating the barrier and the light incident on the gratings being scattered out of the imaging objective's collecting aperture. There results selective etching of the barrier with high tolerance for over exposure.

A process for the direct ablation of metal is also shown. This process includes utilizing a thin metallic layer on a substrate. Thereafter, the thin layer is ablated with the resulting surface being directly useful for a circuit. Alternately, this surface can be plated. In either event, in this latter process and single ablation step yields a layer that is directly useful. For example, where this process is utilized to directly manufacture a circuit, the resulting circuit on a substrate can be 100 times cheaper than the prior art and accomplished in a single step.

In use of either of the above processes, methods of fabrication of a surface layer or layers are disclosed which are up to 100 times cheaper that those steps of the prior art and necessarily include great and corresponding increases in yield.

DESCRIPTION OF THE PREFERRED EMBODIMENT

Figure 1:
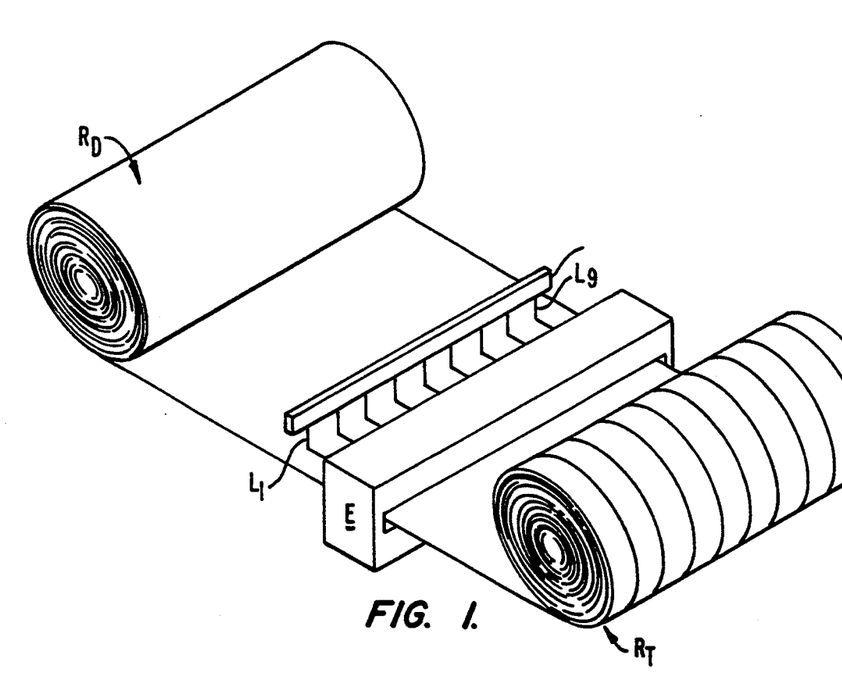
FIG. 1 illustrates a process for low cost antenna fabrication in which copper foil with etch barrier applied passes under ablating laser light to yield etched slots in the barrier which upon subsequent wet etch can produce fine wires which are rolled up into an antenna.

Referring to FIG. 1, a schematic of a system for the laser ablation of barrier covered copper substrate is illustrated. A dispensing roll $R_D$ of barrier covered copper foil on a substrate is dispensed serially to a take up roll $R_T$. The dispensed materially sequentially passes under high intensity light sources $L_1$ to $L_9$ which ablate the barrier. In the particular case here for the manufacture of antenna, ablation occurs in side-by-side strips.

Thereafter, the serially dispensed substrate passes through wet etch apparatus E and onto take-up roller $R_T$. Since wet etching is well known and understood, it will not be discussed further herein except to note that it is only schematically illustrated herein.

In the particular case herein, the protective layer that is not ablated is left in place. When the antenna material is rolled to take up roller $R_T$, the layer that is not ablated serves as insulation.

Figure 2:
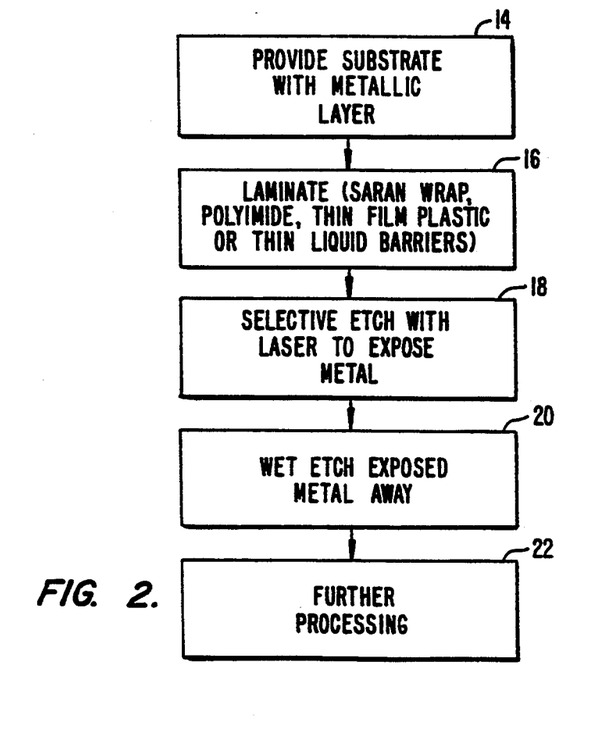
FIG. 2 is a block diagram illustrating the process steps required to produce the antenna.

Referring to FIG. 2, a block diagram of all of the steps schematically included in FIG. 1 is illustrated. The first step 14 requires providing a metallic layer on a substrate. The second step 16 is for lamination with the barrier to be ablated by laser. Lamination can include polyimide, Saran Wrap, a thin film plastic or even a liquid layer—preferably one that cures to form a solid covering over the metallic substrate.

Thereafter, a selective etch 18 occurs. Here it is shown with straight lines from lasers. As will be apparent, any means of imaging high energy light having sufficient energy to cause the desired ablation will do. Preferably, phase reticle masks with scanning laser can be utilized.

The final step 20 of the process is a wet etch of the exposed metallic layer from the ablation.

Further processing can occur. As shown in 22, this further processing can include many different steps including removing the barrier.

Phase plates can be used in numerous ways. For example, plates having both image information and focus for production of images at the focal distance from the plate can be used, such as those Fresnel zone plates or phase masks described in U.S. patent application 07/940,008 entitled Use of Fresnel Zone Plates for Material Processing (a Continuation of U.S. Ser. No. 07/612,212 filed Nov. 9, 1990, abandoned) by Bruce G. MacDonald, Robert O. Hunter, Adlai Smith and Clark C. Guest (now U.S. Pat. No. 5,362,940 issued Nov. 8, 1994) which applications are all owned by the common assignee herein, Litel Instruments, Inc., incorporated herein by reference for all purposes.

It is not required or preferred that the phase plate utilized have both image and focus information. The preferred way of selective ablation of the barrier is to use phase plates having the outline of the desired metal lines disposed in so-called "blocking regions." These phase plates have the image desired configured on their surface and scatter or block light passing through the plates in either the positive or negative image of the final pattern desired. Phase plates of the type useful in this invention are claimed and described in U.S. patent application Ser. No. 07/833,939 filed Feb. 10, 1992 by Adlai H. Smith and Robert O. Hunter entitled High Power Phase Masks for Imaging Systems (now U.S. Pat. No. 5,328,785), and assigned to the common assignee herein. This application is also incorporated herein by reference for all purposes.

A preferred embodiment for such a plate is illustrated with respect to FIG. 3A–3D.

Figure 3A:
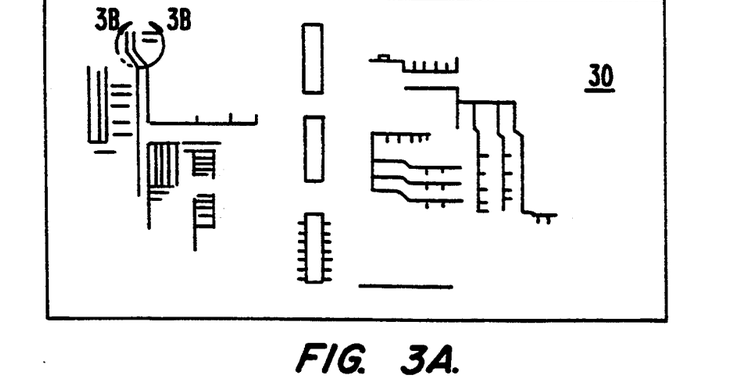
FIGS. 3A, 3B, 3C and 3D are respective views of a circuit having the desired metal traces to be produced (FIG. 3A), a series of metallic lines desired to be produced taken from a micro portion of FIG. 3A (See FIG. 3B), gratings in the pattern of FIG. 3B applied to a quartz plate in the image of the metal traces desired (FIG. 3C), and the etch block and metal material remaining after the etching step (FIG. 3D)
Figure 3B:
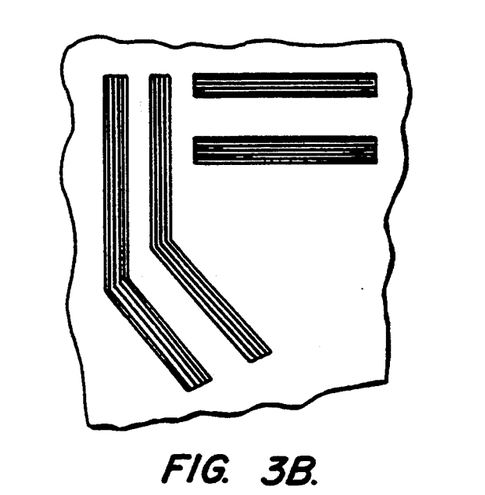

FIG. 3A is plan view of a circuit 30 having the desired metal traces to be produced. FIG. 3B is an expanded segment of that circuit having a series of metallic line traces desired to be produced taken from a micro portion of FIG. 3A.

Figure 3C:
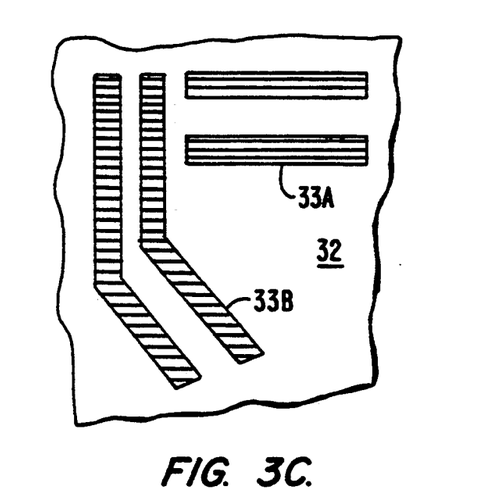
Figure 3D:
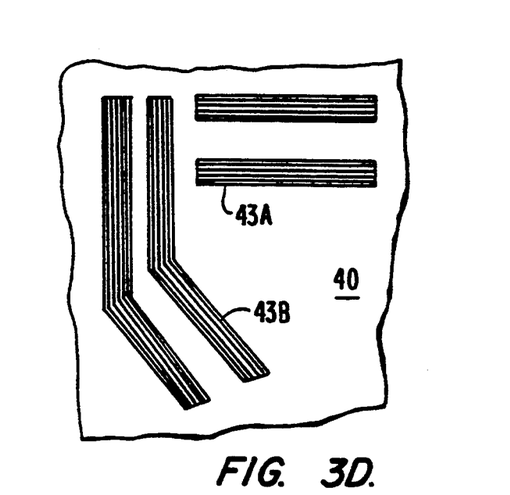

FIG. 3C illustrates a portion only of a glass crystal quartz or fused silica plate. This glass crystal quartz or fused silica plate has gratings $33_A$ and $33_B$ etched in the pattern of FIG. 3B. Such etching preferably occurs to the plate with direct write electron beam lithography. Direct laser written or photo lithographically produced contact prints are equally well suited. This application occurs in the exact image of the metal traces desired from FIG. 3A and consequently possesses a simple 1 to 1 correspondence to the line image ultimately desired.

A word about the function of the gratings. These gratings—although placed in the precise image of the circuit 30 on the plate 32—do not contain either image information or focus. Instead it is the function of these gratings to deflect light. According, by passing light through quartz or fused silica plate 32, light energy having sufficient intensity to selectively etch a barrier underlying all of plate 32 can occur. However, gratings $33_A$ and $33_B$ will deflect such light. Consequently, an underlying work piece 40 consisting of barrier coated metallic substrate will be ablated with the image of FIG. 3D having the barrier retained in strips $43_A$ and $43_B$.

The grating spacing is chosen so that its scattered light is intercepted at the imaging objective's aperture stop. The largest allowable grating period ($GP_{max}$) which is effective is determined by a number of factors, such as the desired resolution and the source. For an imaging objective with collecting numerical aperture NA, and laser light with effective numerical aperture NA', the $GP_{max}$ is given by:

$$GP_{max} = \frac{\sigma}{(2NA + NA')}.$$

This formula assumes we are interested in imaging features down to the diffraction limit of the objective.

If not, the $GP_{max}$ is somewhat larger but not by more than a factor of 2.

Typically, $\sigma = NA'/NA$ will be in the range of $\sigma = 0.1$ –0.4, and the imaging objective might have an $NA = 0.05$. With a KrF laser source, $\lambda = 248$ μm, the formula for $GP_{max}$ would give $GP_{max} = 2.4$ μm for a feature size on the mask of 1.2 μm. Taking into account the desired system resolution would make these values somewhat larger.

The patterning process utilizes a masking material on the metal covered substrate which is left behind on the traces after exposure. This etch barrier acts like a positive resist in that the regions exposed to light (excimer laser) are removed but differs in that it requires no post exposure developing process. The masking material is a partially cured polyimide layer, <5 μm thick After exposure, the metal covered substrate is possibly cleaned and then subtractiveiy etched to produce the desired trace pattern, which will be in the image of FIG. 3D.

Figure 4:
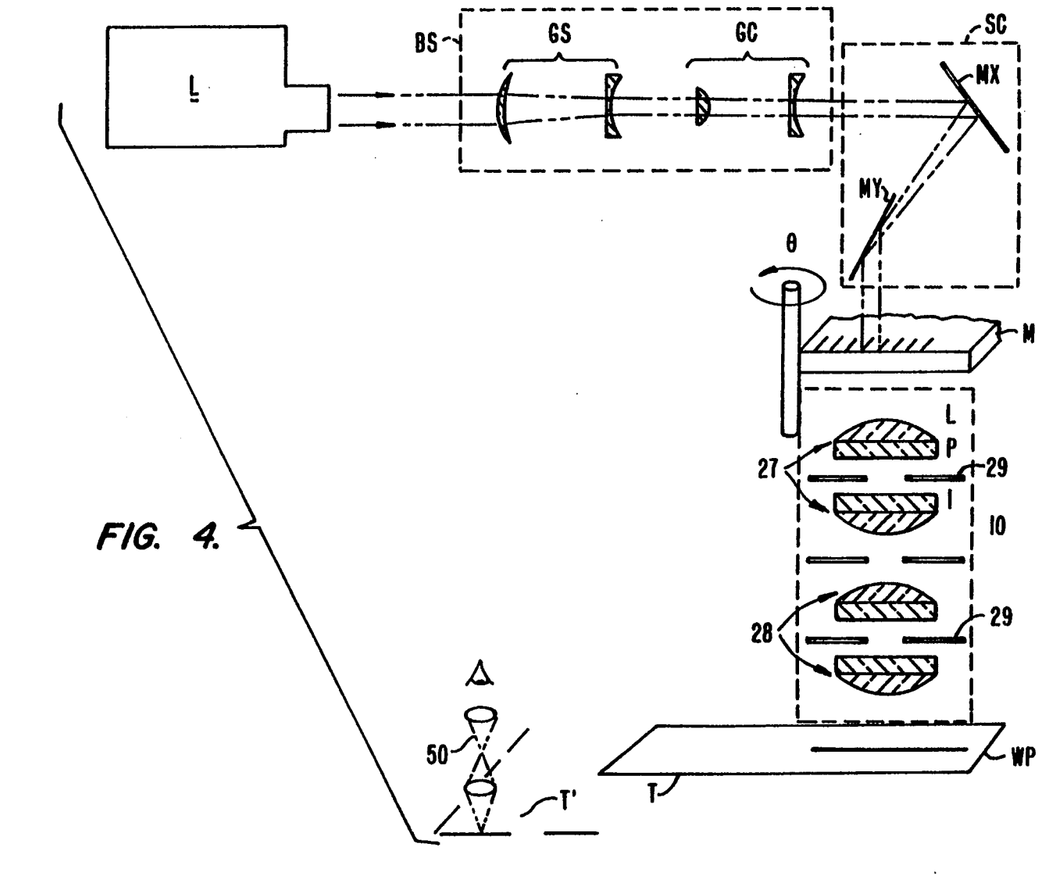
FIG. 4 is a schematic view of a laser etch apparatus including sequentially a laser emitting light at the ablating wavelength and intensity, beam shaping optics, beam and objective scanning subsystem; a plate having the metallic line image information positioned between the beam scanning apparatus and the correspondingly scanned imaging objective; and finally the work piece.

Patterning of the polyimide layer uses a phase reticle scanning ablation system (See FIG. 4). A KrF excimer laser (248 nm) beam L is compressed and projected onto a phase only reticle mask M. A 1 to 1, doubly telecentric, non-inverting imaging objective IO projects the phase reticle image onto the substrate. This imaging objective includes four lenses or lens groups divided into paired sequential couplets 27, 28 with stops 29 therebetween. These lenses essentially image the light and together with the stops prevent scattered light from the gratings reaching the work piece.

Working fluence from laser L on the mask is anticipated to be in the range of ~400 millijoules/cm$^2$. At this level thin (~1000 Å) metallic layers can be ablated; thick metal layers can be damaged by prolonged exposure. To constantly withstand this fluence, a phase only reticle mask is used. Design and construction of the imaging objective is kept relatively simple by restricting its field of view to a 5 mm square. While the preferred embodiment utilizes a 4 element or 4 group all refractive imaging objective, it is understood that hybrid refractive/diffractive objectives could be equally well used. Furthermore, other imaging objectives having the appropriate characteristics and resolution could be used.

Some understanding of the working fluence is helpful. A typical laser utilized in this application turns on and off 100 times per second. The "on" duty cycle is in the order of 10 nano-seconds. Each pulse will deliver power to the surface in the order of $400 \times 10^{-3}$ joules. For the desired etching during a scan, 1 to 100 pulses will be utilized. This produces a level of power that is in the order of 4 to 400 times the light fluence used for photoresist.

It will be understood that it is inevitable that some "double exposure" occur on account of scanning. However, such exposure has little or no effect on the disclosed process. The difference between that amount of light energy to ablate the barrier and that required to damage the metal substrate is large—in the order of a factor exceeding 1000. This being the case, any double exposure during the scan has minimal result once etching has occurred. Furthermore, the remaining etch barrier material is barely affected by double exposure since the laser fluence on it is very close to, or below the etching threshold and it therefore is not etched at all or is etched at a rate 10 times or more slowly than the nominally exposed regions.

Further, and regarding the problem of light spill, light fluence that is below the etching threshold will have little or no etching effect. The barrier will not accumulate or integrate light from spill.

By way of example, a polyimide layer may ablate at 20 to 30 millijoules per square centimeter. By way of contrast, aluminum will not be damaged until energy levels reach well in excess of 1 joule per square centimeter.

Further contrasting the etching set forth herein from conventional photoresist exposure, it will be understood that conventional masks are conventionally chrome, aluminum or iron oxide opaque masks, or dielectric masks. At the light fluences here utilized, such conventional masks M may be destroyed. Consequently, the use of a grating on quartz or fused silica are utilized.

Regarding the etching of metal, some observations may be made. Dependent upon the power output of the laser, first heating of the metal substrate, then melting of the metal substrate and finally evaporization in the order of microns—dependent upon the power level—occurs. Where evaporization occurs, the metallic trail in the wake of light exposure is essentially clean. For example where copper with a covering of copper oxide is vaporized, the process leaves freshly exposed metal which can thereafter readily be plated.

It should be understood that this process can be quite effective on thin metal layers (eg in the order of 1,000 to 2,000 Å thick. In this case, heat causes vaporization quickly because the substrate normally is a weak heat conductor.

It is the preferred embodiment herein to scan a phase plate with a laser to effect ablation. The reader should understand that certain large lasers can ablate an entire area with either single or multiple pulses without being scanned; the only requirement here is that the laser pulse contain the required selective etch pattern, preferably with a phase mask.

The action of the tool is as follows:

Beam shaping optics BS including Galilean spherically symmetric beam expander GS and Galilean cylindrical beam expander CG turn the rectangular laser beam into an approximate square slightly larger than the imaging field. Scanning mirrors SC parallel transport the beam over the reticle mask M. The mask M remains stationary during ablation.

From this description, it will be understood that mask M can have the same dimension of the circuit desired. Consequently, problems of such images being large or the connection of adjacent images (the so-called "stitching" problem) are avoided. Using the technique herein, one can make the original image as large as needed for the final product, even though the scanning beam is quite small.

In step with the scanning mirrors, the imaging objective IO is scanned over the work piece. The coordination of motion between the scanning mirrors SC and imaging objective IO is important for maintaining ablation uniformity but does not seriously impact pattern registration since the phase mask and substrate are kept fixed during exposure. Of course, imaging objective pitch and yaw during motion must be kept at acceptable levels. Once a single pattern has been exposed, the X-Y table supporting the work piece is translated to a new position and the process is repeated.

From this description it is clear that the only limitations on the individual pattern size are due to the mechanical range of motion of the laser beam scanners and imaging objective. Limits due to the maximum fabrication sizes of phase reticles can be overcome by using several separate reticles whose fields are stitched together in the exposure process by using the substrate X-Y table and mask e stage. The work piece WP format or lay up of individual patterns is limited in size only by the X-Y table T supporting it. Long travel X-Y stages permit large formats.

Registration of the pattern to the substrate is achieved using an offset microscope 50. This allows for simple optical alignment and machine vision software can be incorporated to automate the process. Compensation for offsets is taken care of by the substrate X-Y table and the Θ stage holding the reticle or phase mask M. The Θ stage is located at the phase mask M instead of the substrate so that angular errors are not magnified by the lever arms associated with lay ups of large numbers of parts. The registration procedure involves exposing a scrap substrate, translating it over to the alignment microscope (as shown by the table position T', and noting the locations of projected fiducial marks or any other well defined set of marks in the pattern. itself. The position of these marks being noted, the tool is ready to expose registered parts.

Software for reticle mask making requires that the native CAD format be interpreted, then modified to include the appropriate phase structures, and finally output into the appropriate e-beam format. Because of the potentially huge number of shapes generated, the resulting data set must be compressed as much as possible. For example, in the fabrication of the mask M by an E-beam, the software will take GDS-II (a common CAD output) and convert it to a phase reticle which is defined by a MEBES data set (commonly accepted software that drives and precisely positions E-beams).

The throughput of this tool is mainly determined by the ablation rate and laser power and is in the range of 0.12–0.25 in$^2$/sec.

PROCESS DESCRIPTION

It will be understood that the ablation technique herein disclosed will admit of a number of variations. Four such variations are specifically disclosed. Utility can be realized by using the processes in various applications. These applications can include antennas, very high density circuit boards, multi-chip modules, metallization patterns for integrated optic control, metallization patterns for the direct patterning of chips, and direct etch on chips for both metal and dielectric layers.

It will be apparent that the disclosed process of FIGS. 1 and 2 can be utilized in a number of ways. Such ways are illustrated with respect to FIGS. 5–8.

1. Direct laser removal of etch blocking material for fine metal structures

Figure 5:
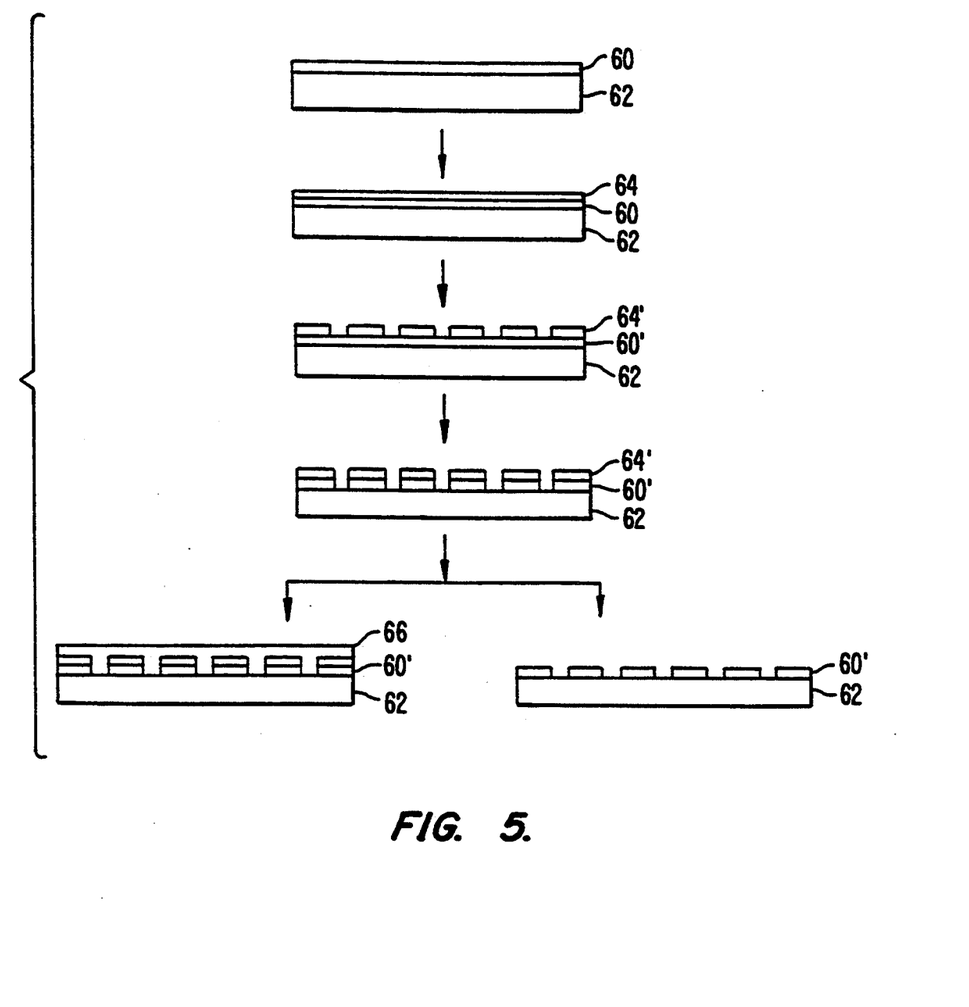
FIG. 5 illustrates sequentially the process steps in laser removal of etch blocking material for metal patterning.

This process sequence is shown in FIG. 5. A thick (>0.5 μm) metal coating 60 is placed on a substrate 62 The metal is over coated with an etch block material or barrier 64. The laser patterning is used to remove the etch block or barrier selectively (see 64') without removing the metal 60. The etch block is chosen for its laser ablating properties, cost, and adherence. It can be polyimide, Saran Wrap®, or essentially any material with good etch properties under the light levels herein utilized. If it is to be used to insulate metal layers, i.e., left on, then it must be selected based on its electrical properties as well.

Once the etch block is removed, with perhaps a cleaning step, an etch to remove the metal layer is used resulting in the remaining metal 60'. Typically, this can be wet etched or using a dry etch such as RIE. For fine electrical circuits, a wet etch is suitable for the lowest cost. The etch block is left intact if it is to be used for insulation (see 64'). Usually, it would be removed prior to further processing steps (see right schematic). This sequence, with the addition of dielectric (polyimide) coating 66, via formation, and metal coating, may be continued to form an MCM interconnect structure layer. Such processing can be used to form an entire integrated multi connection module. It is useful for forming other fine metal structures as well.

2. Laser Form Ablation Followed by Plating

Figure 6:
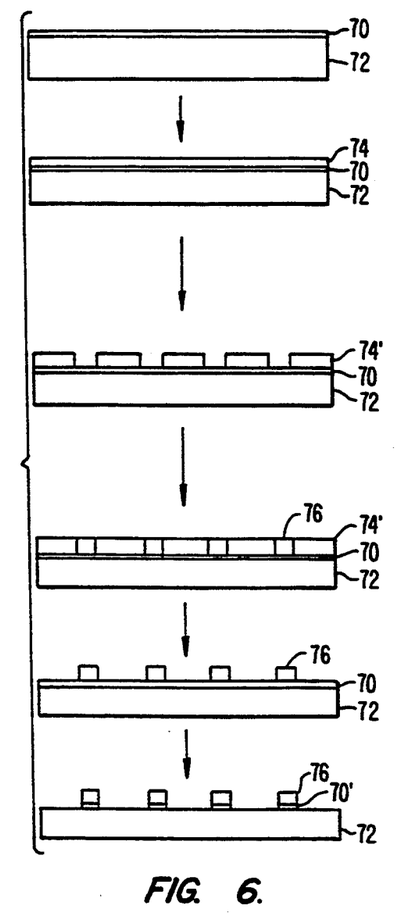
FIG. 6 illustrates sequentially the process steps in laser form ablation followed by plating.

Referring to the process sequence illustrated in FIG. 6, metal (thin) 70 is deposited on a substrate. Then, a layer of material, termed an ablation form or barrier 74, is added. This material is picked primarily for cost, adherence, and laser ablation properties. If it is to remain as an electrical insulator, it is also chosen on the basis of electro-mechanical properties. This material is then laser patterned, cleaned, and prepared for plating. A plating process (electrolytic or electroless) is then used to add metal 76 into the open areas left in the form. Etch back is used to remove the original metal coat 70 after form removal (or, if there is no substrate, directly). The metallization pattern is subsequently processed.

3. Etch Enhancement

Figure 7:
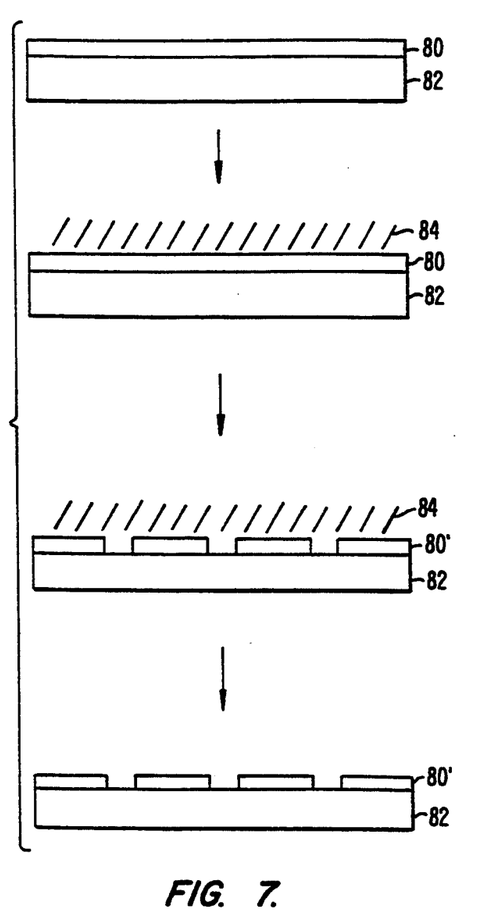
FIG. 7 illustrates sequentially the process steps in an enhanced laser etch; and, FIG. 8 illustrates sequentially the process steps in thin metal layer removal.

Referring to FIG. 7, this uses direct metal etch assisted by a chemical. The metal coated substrate is placed in a gas or liquid environment 84. Then, the patterned laser light is used to remove the surface selectively (see 80'. A typical etching atmosphere would be $Cl_2$ for use with an excimer laser on Cu.

4. Direct etch metal removal

Figure 8:
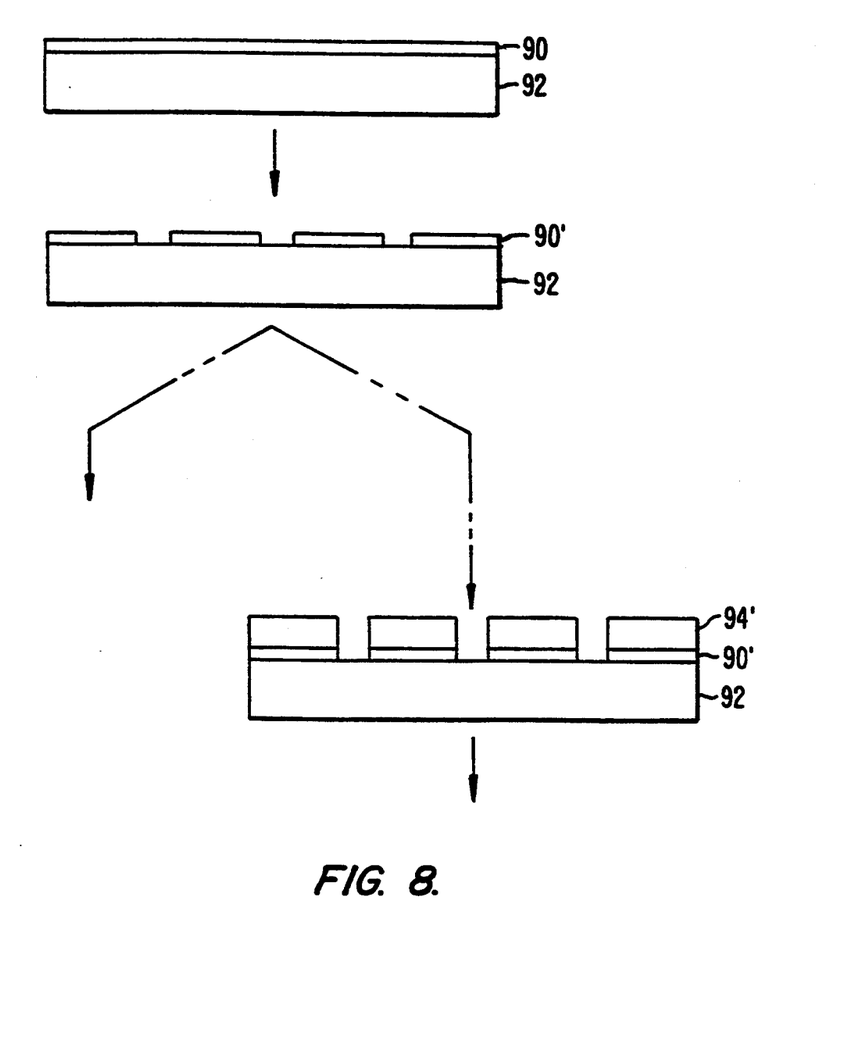

Referring to FIG. 8, a thick metal coating 90 on a substrate 92 can be directly patterned with high efficiency. The circuit can then be used, or if more metal is needed, it can be added by plating up on the conductor pattern (see 94'). For this, a thin film ~2000 Å of A1 or Cu may be removed in a single pulse with an excimer laser. The use of electroless or electroplating can result in traces of the desired thickness. Thick layers can be removed by sequential pulses with good process control. High fluence will be required for thicker layers.

The reader will understand that the above process are exemplary. Other sequences of processing can be used with the laser patterning utility of this invention.

What is claimed is:

1. A process for forming a collection of fine metallic features comprising the steps of:
   providing a mask;
   providing said mask with gratings in a pattern to produce in light projected through said mask which is selected from a class including the positive and negative of said collection of metal features, said mask including first areas for transmitting light and second areas for scattering light transmitted through said mask;
   providing a substrate having an exposed metal layer;
   applying an etch barrier over said exposed metallic layer;
   passing light through said mask with sufficient energy to remove said barrier at locations corresponding to said first areas of said mask exposing said metallic layer underneath said barrier in a pattern which is selected from a class including the positive and negative of said collection of fine metal features.

2. The process of forming fine metallic features according to claim 1 including the step of:
   etching said substrate to remove said exposed metallic layer.

3. The process of forming fine metallic features according to claim 1 and including:
   removing said remaining barrier to expose remaining metallic layer under said barrier.

4. The process of forming fine metallic features according to claim 1 and including:
   plating said exposed metallic layer.

5. The process of claim 1 and wherein said provided substrate is a copper substrate.

6. The process of claim 1 and wherein said applied etch barrier is selected from a class including polyimide, vinylidene chloride polymers, and plastic.

7. The process of claim 1 and wherein said step of passing light through said mask includes the step of passing coherent light energy through said mask.

8. The process of claim 1 and wherein said step of passing light through said mask includes the step of:

scanning said mask with said light energy.

9. The process of claim 2 wherein said step of etching said substrate is a wet etching process.

10. The process of claim 1 and wherein said step of passing light through said mask includes emitting said light from a laser.

11. Apparatus for creation of a collection of fine metallic features on a substrate comprising:
   a substrate having an exposed metal layer;
   an etch barrier over said exposed metal layer;
   a light source having light energy sufficient to selectively remove said etch barrier and expose said metallic layer underneath said barrier;
   a mask, said mask provided with gratings in a pattern to produce by light projected through said mask which is selectred from a class including a positive and negative image of said collection of metal features in said etch barrier, said mask including first areas for transmitting light and second areas for scattering light incident on said mask;
   means for directing light from said light source onto said mask;
   means for imaging light from said mask to said substrate.

12. The apparatus of claim 11 and wherein said substrate is a copper substrate.

13. The apparatus of claim 11 and wherein said barrier is selected from a class including polyimide, vinylidene chloride polymers and plastic.

14. The apparatus of claim 11 and wherein said means for etching said barrier includes:
   a light source which is a coherent light source.

15. The apparatus of claim 14 and wherein said selectively etching said barrier includes the step of:
   means for scanning said mask with said light energy.

16. The apparatus of claim 11 and wherein said step of etching said barrier with light energy includes emitting said light from a laser.

17. Apparatus for creation of fine metallic features on a substrate comprising:
   a substrate having a metal layer covered with a barrier;
   a light source having light energy sufficient to selectively remove said barrier and expose said metallic layer underneath said barrier;
   a mask having image information of said fine metallic features, said mask positioned between said light source and substrate and including first areas on said mask for transmitting light and second areas on said mask for scattering light;
   means for optically projecting said mask to said substrate including an imaging system for relaying light incident on said mask from said light source and passing through said first areas and rejecting light scattered by said second areas.

18. The apparatus of claim 17 and wherein material comprising said mask is selected from a group including quartz glass and fused silica.

19. The apparatus of claim 17 and wherein said means for optically projecting said light includes stop means for intercepting light scattered by said second areas in said mask.

20. A process of forming fine metallic lines comprising the steps of:
   providing a substrate having an exposed metal layer;
   providing a light source having light energy sufficient to selectively remove said exposed metal layer;
   providing a mask having image information of said fine metallic features, said mask positioned between said light source and substrate and including first areas in said mask for transmitting light and second areas in said mask for scattering light; and
   selectively etching said metal of said substrate with light energy sufficient to remove said metal and expose said substrate underneath, the remaining metal being in the pattern of said collection of fine metal features.

21. A process of forming fine metallic features according to claim 20 and including:
   plating metal remaining on said substrate.

22. A process of forming fine metallic features according to claim 20 and wherein said selective etch utilizes chemically enhanced etching.

23. A process of forming fine metallic features according to claim 20 and wherein:
   said selective etch utilizes a single laser pulse.

* * * * *